United States Patent
Naruse et al.

(10) Patent No.: US 8,035,154 B2
(45) Date of Patent: Oct. 11, 2011

(54) SEMICONDUCTOR DEVICE INCLUDING A PLURALITY OF MEMORY CELLS WITH NO DIFFERENCE IN ERASING PROPERTIES

(75) Inventors: Takayoshi Naruse, Okazaki (JP); Mitsutaka Katada, Toyokawa (JP); Tetsuo Fujii, Toyohashi (JP)

(73) Assignee: DENSO CORPORATION, Kariya (JP)

( * ) Notice: Subject to any disclaimer, the term of this patent is extended or adjusted under 35 U.S.C. 154(b) by 147 days.

(21) Appl. No.: 12/289,799

(22) Filed: Nov. 4, 2008

(65) Prior Publication Data
US 2009/0114974 A1    May 7, 2009

(30) Foreign Application Priority Data

Nov. 7, 2007  (JP) ................................. 2007-289407
Oct. 14, 2008  (JP) ................................. 2008-264848

(51) Int. Cl.
*H01L 29/788* (2006.01)
(52) U.S. Cl. ......... 257/316; 257/318; 257/261; 257/321
(58) Field of Classification Search .................. 257/316, 257/260, 261, 300
See application file for complete search history.

(56) References Cited

U.S. PATENT DOCUMENTS

| | | | |
|---|---|---|---|
| 4,774,556 A * | 9/1988 | Fujii et al. ..................... | 257/316 |
| 5,338,953 A | 8/1994 | Wake | |
| 5,460,989 A * | 10/1995 | Wake ............................ | 438/259 |
| 6,013,548 A | 1/2000 | Burns, Jr. et al. | |
| 6,034,389 A | 3/2000 | Burns, Jr. et al. | |
| 6,518,126 B2 | 2/2003 | Wu et al. | |
| 6,580,641 B2 | 6/2003 | Wu et al. | |
| 6,717,205 B2 * | 4/2004 | Gratz ............................ | 257/316 |
| 2008/0149997 A1 * | 6/2008 | Jin et al. ........................ | 257/319 |

FOREIGN PATENT DOCUMENTS

JP    A-10-144810    5/1998

OTHER PUBLICATIONS

Notice of Reasons for Refusal mailed on Dec. 15, 2009 issued from the Japanese Patent Office in the corresponding Japanese patent application No. 2008-264848 (and English translation).

* cited by examiner

*Primary Examiner* — Thanh V Pham
*Assistant Examiner* — Caleb Henry
(74) *Attorney, Agent, or Firm* — Posz Law Group, PLC (57) ABSTRACT

A semiconductor device includes a semiconductor substrate, a plurality of memory cells, a plurality of bit lines, and a plurality of source lines. The memory cells are located in the semiconductor substrate. Each of the memory cells includes a trench provided in the semiconductor substrate, an oxide layer disposed on a sidewall of the trench, a tunnel oxide layer disposed at a bottom portion of the trench, a floating gate disposed in the trench so as to be surrounded by the oxide layer and the tunnel oxide layer, and an erasing electrode disposed on an opposing side of the tunnel oxide layer from the floating gate. The bit lines and the source lines are alternately arranged on the memory cells in parallel with each other.

11 Claims, 12 Drawing Sheets

SEMICONDUCTOR DEVICE INCLUDING A PLURALITY OF MEMORY CELLS WITH NO DIFFERENCE IN ERASING PROPERTIES

CROSS REFERENCE TO RELATED APPLICATIONS

The present application is based on and claims priority to Japanese Patent Applications No. 2007-289407 filed on Nov. 7, 2007 and No. 2008-264848 filed on Oct. 14, 2008, the contents of which are incorporated in their entirety herein by reference.

BACKGROUND OF THE INVENTION

1. Field of the Invention

The present invention relates to a semiconductor device including a plurality of memory cells. The present invention also relates a method of manufacturing a semiconductor device.

2. Description of the Related Art

As an example of a portable nonvolatile semiconductor memory device, U.S. Pat. No. 6,034,389 discloses a whole-erasable flash memory that erases all data stored therein collectively. The flash memory has a two-layer gate structure including a floating gate and a control gate. The control gate is disposed on the floating gate through an insulating layer. Data is written into and read from the floating gate by implanting and extracting electron. The control gate functions as a word line.

In a direction perpendicular to the word line, a bit line and a source line are arranged. The two-layer structure configurates a memory cell. The bit line is configured to read data from the memory cell. The source line is configured to drive the memory cell. A plurality of the memory cells is arranged to configurate a memory mat. In the memory mat, a plurality of the bit lines and a plurality of the source lines are alternately arranged in a direction perpendicular to a plurality of the word lines.

Data is written into the flash memory by a hot electron method. A voltage is selectively applied to the word line and the bit line of the memory cell into which the data is written. In addition, an electric current is applied to the source line of the memory cell into which the data is written. Thereby, a channel region is provided between a source and a drain, and an electron accelerated at the channel region and having a high energy is implanted into the floating gate.

The data in the flash memory is erased by a tunnel method. The electron stored in the floating gate is extracted to the source by applying a voltage to the source lines, and thereby the whole data stored in each of the memory cells coupled with the source lines is erased collectively.

In the memory mat, the memory cells are arranged vertically and horizontally. Thus, a wiring resistance is generated in the source lines in the memory mat. When the whole data is erased, an erasing voltage applied to the source line arranged at an inner portion of the memory mat is lower than an erasing voltage applied to the source line arranged at an outer portion of the memory mat due to the wiring resistance. Thus, a difference in an erasing property is generated between the inner portion and the outer portion of the memory mat, and the difference in the erasing property among the memory cells is increased. The difference in the erasing property may cause an error recognition of the data.

If a time for applying the voltage to the memory cells is increased for erasing the data stored in the memory cell arranged at the inner portion of the memory mat, an excess electron may be extracted from the floating gate of the memory cell arranged at the outer portion of the memory mat. Thus, a threshold voltage of the floating gate decreases from an initial threshold voltage, and it becomes difficult to write data into the floating gate. Therefore, it is undesirable to increase the time for applying the voltage to the source lines.

SUMMARY OF THE INVENTION

In view of the foregoing problems, it is an object of the present invention to provide a semiconductor device including a plurality of memory cells. Another object of the present invention is to provide a method of manufacturing a semiconductor device.

A semiconductor device according to an aspect of the invention includes a semiconductor substrate, a plurality of memory cells, a plurality of bit lines, and a plurality of source lines. The memory cells are located in the semiconductor substrate. Each of the memory cells includes a trench provided in the semiconductor substrate, an oxide layer disposed on a sidewall of the trench, a tunnel oxide layer disposed at a bottom portion of the trench, a floating gate disposed in the trench so as to be surrounded by the oxide layer and the tunnel oxide layer, and an erasing electrode disposed on an opposing side of the tunnel oxide layer from the floating gate. The floating gate is configured so that data is written into and read from the floating gate. The erasing electrode is configured to erase the data written in the floating gate. The bit lines and the source lines are alternately arranged on the memory cells in parallel with each other. In the present semiconductor device, a difference in an erasing property among the memory cells due to a position of each of the memory cells can be reduced.

In a manufacturing method of a semiconductor device according to another aspect of the invention, a semiconductor substrate is prepared and a trench is provided in the semiconductor substrate. An oxide layer is formed on a sidewall of the trench and a tunnel oxide layer is formed at a bottom portion of the trench. A floating gate is formed in the trench through the oxide layer and the tunnel oxide layer. A buried trench is provided in the semiconductor substrate so that the buried trench and the floating gate are located on opposite sides of the oxide layer. A buried layer is formed in the buried trench and is thermally diffused from a sidewall of the buried trench to the semiconductor substrate so as to provide a control gate. An erasing electrode is formed on an opposite side of the tunnel oxide layer from the floating gate. In the present manufacturing method, a depth of the control gate can be controlled by controlling a depth of the buried trench.

BRIEF DESCRIPTION OF THE DRAWINGS

Additional objects and advantages of the present invention will be more readily apparent from the following detailed description of preferred embodiments when taken together with the accompanying drawings. In the drawings.

DETAILED DESCRIPTION OF THE PREFERRED EMBODIMENTS

First Embodiment

A semiconductor device according to a first embodiment of the invention can be suitably used for a whole-erasable flash memory that collectively erases the whole data stored therein.

Figure 1A:
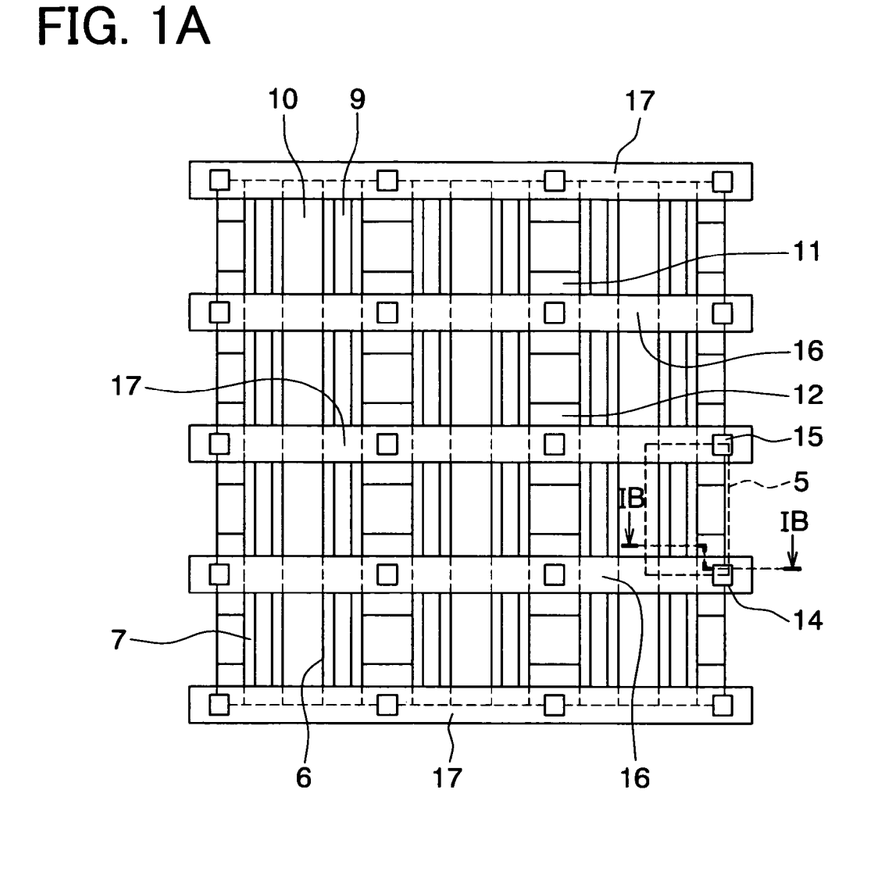
FIG. 1A is a plan view illustrating a semiconductor device according to a first embodiment of the invention and FIG. 1B is a cross-sectional view illustrating the semiconductor device taken along line IB-IB in FIG. 1A.
Figure 1B:
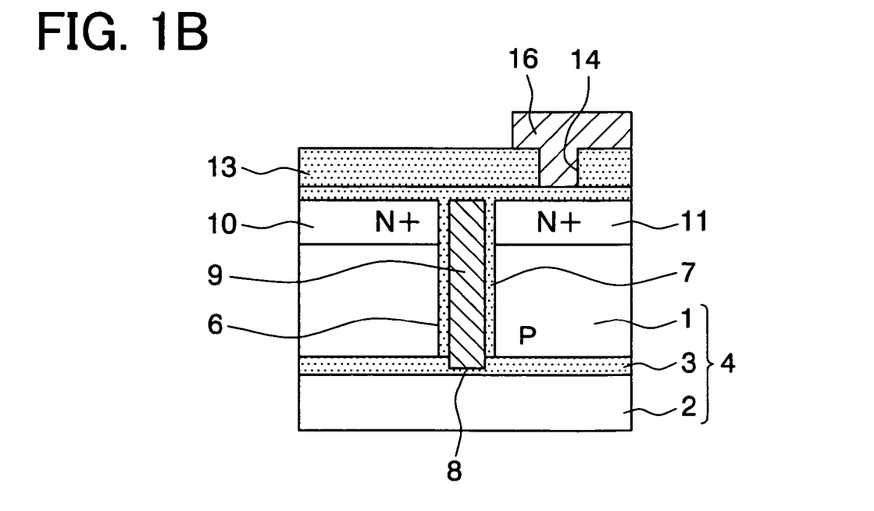

As illustrated in FIG. 1A and FIG. 1B, the semiconductor device includes an element-forming substrate 1, a supporting substrate that can function as a rear electrode 2, and an buried oxide layer 3 disposed between the element-forming substrate 1 and the supporting substrate. The element-forming substrate 1, the rear electrode 2, and the buried oxide layer 3 configurate a silicon-on-insulator substrate (SOI substrate) 4. The element-forming substrate 1 is made of a P type silicon substrate and the supporting substrate is made of a silicon substrate, for example. The buried oxide layer 3 is made of silicon dioxide, for example.

In the SOI substrate 4, a plurality of memory cells 5 is located. Each of the memory cells 5 includes a trench 6. The trench 6 extends to the rear electrode 2 though an N+ type diffusion layer formed at a surface portion of the element-forming substrate 1, the element-forming substrate 1, and the buried oxide layer 3. An oxide layer 7 is disposed on a sidewall of the trench 6, and a tunnel oxide layer 8 that is thinner than the buried layer 3 is disposed at a bottom portion of the trench 6. The oxide layer 7 is made of silicon dioxide, for example. The tunnel oxide layer 8 is an insulating layer having a thickness about 10 nm, for example. The tunnel oxide layer 8 is configured so that an electric current can pass through the tunnel oxide layer 8.

In the trench 6, a floating gate 9 made of polysilicon is filled through the oxide layer 7 and the tunnel oxide layer 8. Data is written in and read from the floating gate 9. The oxide layer 7 is also disposed on an opposite side of the floating gate 9 from the tunnel oxide layer 8. Thus, the floating gate 9 is insulated by the oxide layer 7 and the tunnel oxide layer 8.

The N+ type diffusion layer is in contact with the oxide layer 7 disposed on the sidewall of the trench 6. A part of the N+ type diffusion layer located on one side of the trench 6 provides a control gate 10 functioning as a word line. The control gate 10 is an electrode used for writing data into the floating gate 9. The other part of the N+ type layer located on an opposite side of the trench 6 from the control gate 10 provides a source region 11 and a drain region 12. In the whole of the semiconductor device, a plurality of the source regions 11 and a plurality of the drain regions 12 are alternately arranged in an extending direction of the control gates 10. A part of the element-forming substrate 1 is located between the source region 11 and the drain region 12. The part of the element-forming substrate 1 provides a channel region at a portion adjacent to the trench 6.

A protective layer 13 is disposed on the element-forming substrate 1 through the oxide layer 7. The protective layer 13 has contact holes 14 and 15. The contact hole 14 extends toward the source region 11 and the contact hole 15 extends toward the drain region 12.

A source line 16 is disposed on the protective layer 13 so as to fill in the contact hole 14. The source line 16 is coupled with the source region 11. A bit line 17 is disposed on the protective layer 13 so as to fill in the contact hole 15. The bit line 17 is coupled with the drain region 12. In the whole of the semiconductor device, a plurality of the source lines 16 and a plurality of the bit lines 17 are alternately arranged in parallel in a direction perpendicular to the extending direction of the control gates 10.

The rear electrode 2 is located on an opposite side of the tunnel oxide layer 8 from the floating gate 9. The rear electrode 2 is configured to erase the data in the floating gate 9. In the present embodiment, all of the memory cells 5 in the semiconductor device share the one rear electrode 2. The rear electrode 2 is an N+ type layer, for example. A protective layer 29 disposed on the source line 16, and a protective layer 33 and a wiring layer 32 disposed on the rear electrode 2 are not illustrated in FIG. 1B.

The memory cells 5 each having the above-descried structure are arranged vertically and horizontally so as to configurate a memory mat, as illustrated in FIG. 1A.

An exemplary process for manufacturing the semiconductor device will now be described with reference to FIG. 2A-FIG. 8F. In the plan views in FIG. 2A-FIG. 8F, components including the floating gate 9 and the oxide layer 7 are illustrated with solid lines and dashed lines for showing positions and boundaries.

Figure 2A:
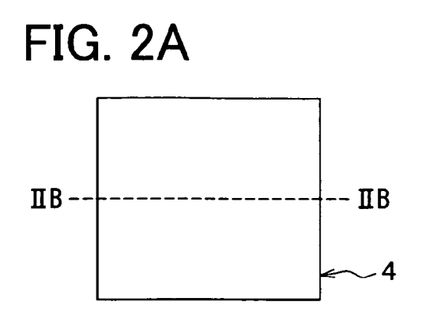
FIG. 2A, FIG. 2C, FIG. 2E, and FIG. 2G are plan views illustrating the semiconductor device in a manufacturing process.
Figure 2B:
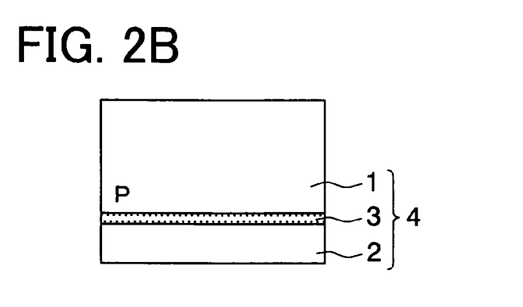
FIG. 2B, FIG. 2D, FIG. 2F, and FIG. 2H are cross-sectional views illustrating the semiconductor device taken along line IIB-IIB in FIG. 2A, line IID-IID in FIG. 2C, line IIF-IIF in FIG. 2E, and line IIH-IIH in FIG. 2G, respectively.
Figure 2C:
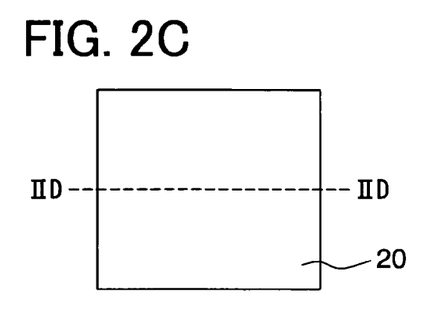
Figure 2D:
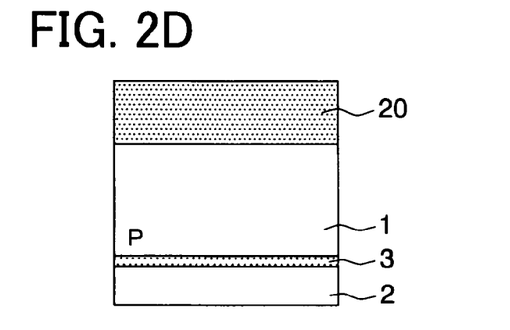

In a process illustrated in FIG. 2A and FIG. 2B, the SOI substrate 4 is prepared. The SOI substrate 4 includes the element-forming substrate 1, the supporting substrate that becomes the rear electrode 2, and the buried oxide layer 3 disposed between the element-forming substrate 1 and the supporting substrate. The element-forming substrate 1 has a P type conductivity. The SOI substrate 4 has a wafer shape, for example. In a process illustrated in FIG. 2C and FIG. 2D, an oxide layer 20 is formed on the element-forming substrate 1.

Figure 2E:
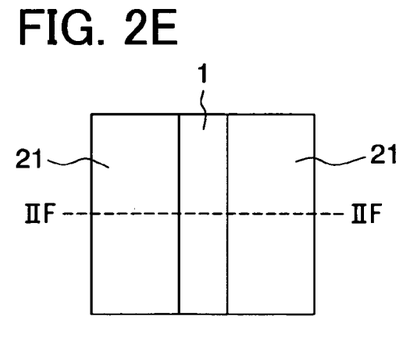
Figure 2F:
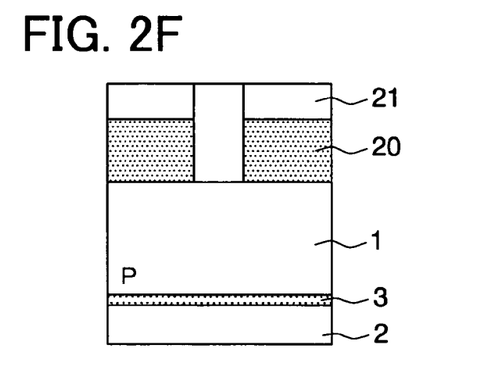

In a process illustrated in FIG. 2E and FIG. 2F, a resist 21 is formed on the oxide layer 20. The resist 21 is pattern-formed by a photolithography process. The oxide layer 20 is etched, for example, by dry etching using the resist 21 as a mask. Then, the resist 21 is removed.

Figure 2G:
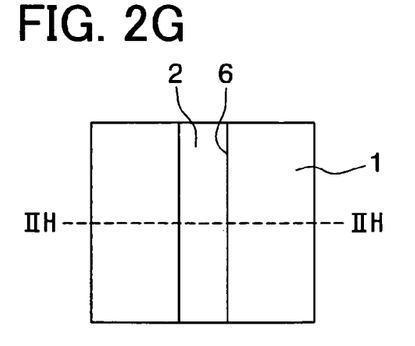
Figure 2H:
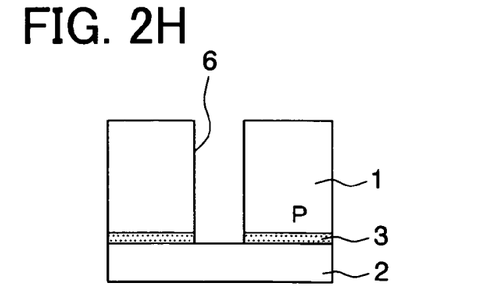

In a process illustrated in FIG. 2G and FIG. 2H, the trench 6 is provided by using the oxide layer 20 as a mask. The trench 6 extends to the supporting substrate through the buried oxide layer 3, and the supporting substrate is exposed to an inside of the trench 6. Then, the oxide layer 20 is removed.

Figure 3A:
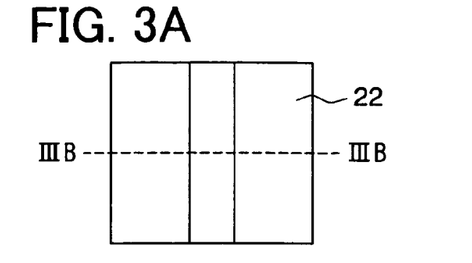
FIG. 3A, FIG. 3C, FIG. 3E, FIG. 3G and FIG. 3I are plan views illustrating the semiconductor device in the manufacturing process.
Figure 3B:
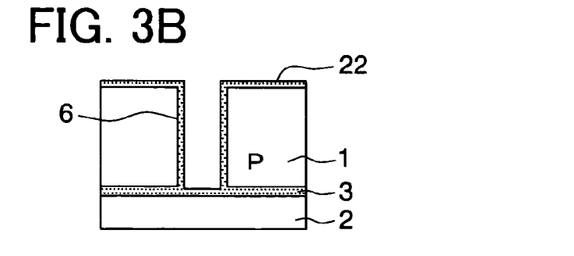
FIG. 3B, FIG. 3D, FIG. 3F, FIG. 3H, and FIG. 3J are cross-sectional views illustrating the semiconductor device taken along line IIIB-IIIB in FIG. 3A, line IIID-IIID in FIG. 3C, line IIIF-IIIF in FIG. 3E, line IIIH-IIIH in FIG. 3G, and line IIIJ-IIIJ in FIG. 3I, respectively.

In a process illustrated in FIG. 3A and FIG. 3B, the SOI substrate 4 is thermally oxidized so that an oxide layer 22 is formed at the surface portion of the element-forming substrate 1. Thereby, the oxide layer 22 is also formed on the sidewall of the trench 6.

Figure 3C:
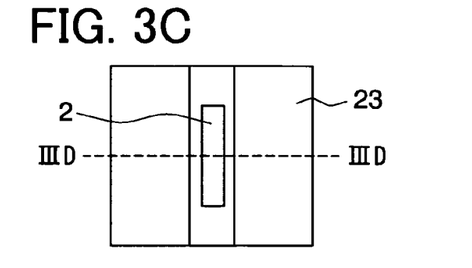
Figure 3D:
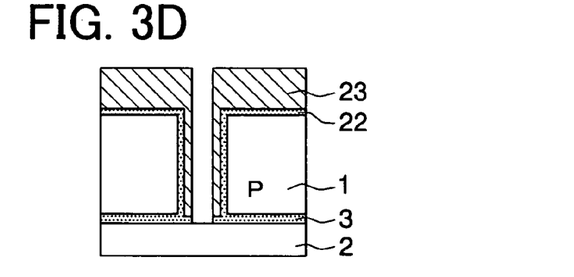

In a process illustrated in FIGS. 3C and 3D, a resist 23 is formed on the oxide layer 22. The resist 23 is pattern-formed so that the resist 23 has an opening above the bottom portion of the trench 6. A part of the oxide layer 22 located at the bottom portion of the trench 6 is removed, for example, by dry etching using the resist 23 as a mask. Thereby, a surface of the supporting substrate is exposed to the inside of the trench 6.

In the present process, the resist 23 is pattern-formed so that the resist 23 covers the oxide layer 22 located on the sidewall of the trench 6. Thus, when the oxide layer 22 located at the bottom portion of the trench 6 is removed, the oxide layer 22 located on the sidewall of the trench 6 remains. The oxide layer 22 located on the sidewall of the trench 6 becomes the oxide layer 7 illustrated in FIG. 1B.

Figure 3E:
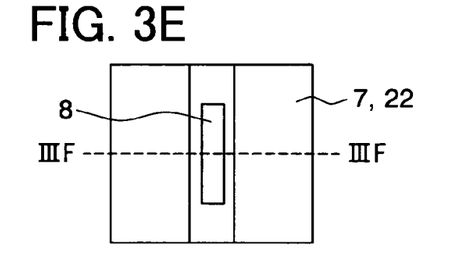
Figure 3F:
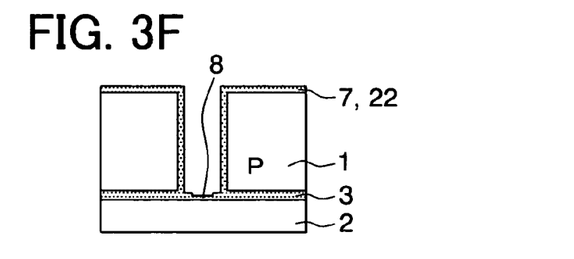
Figure 3G:
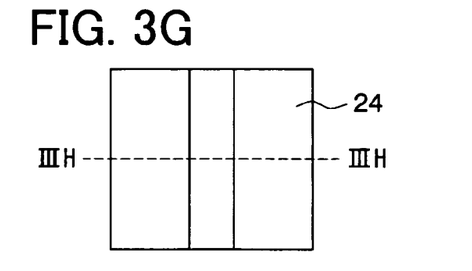
Figure 3H:
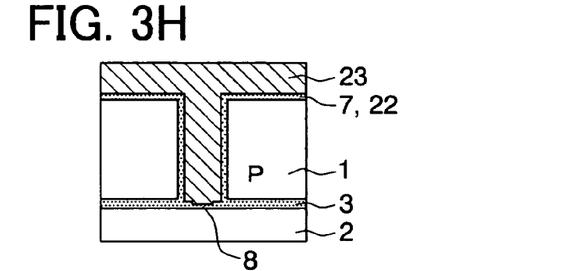

In a process illustrated in FIGS. 3E and 3F, the tunnel oxide layer 8 is formed on the surface of the supporting substrate exposed to the inside of the trench 6. The tunnel oxide layer 8 is provided for extracting electron from the floating gate 9 to the rear electrode 2. The tunnel oxide layer 8 has a thickness about 10 nm, for example. In a process illustrated in FIG. 3G and FIG. 3H, a polysilicon layer 24 is formed on the oxide layer 23 and the tunnel oxide layer 8 so as to fill the trench 6.

Figure 3I:
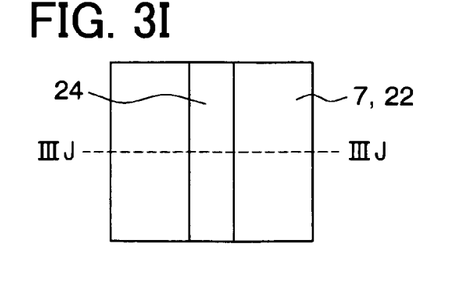
Figure 3J:
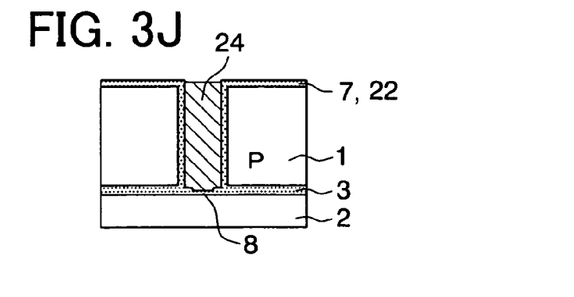

In a process illustrated in FIG. 3I and FIG. 3J, the polysilicon layer 24 located at an outside of the trench 6 is removed, for example, by dry etching. The polysilicon layer 24 may also be removed by chemical mechanical polishing.

Figure 4A:
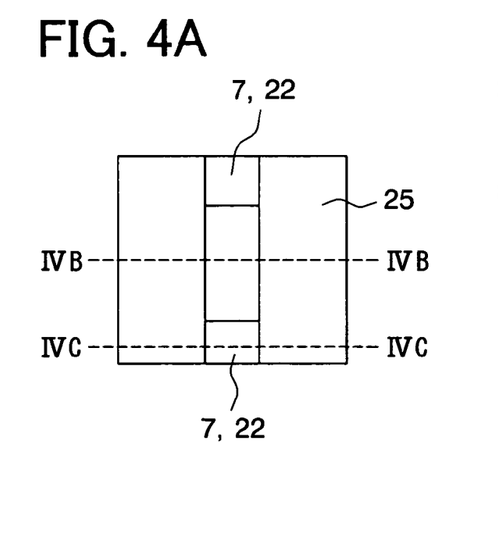
FIG. 4A and FIG. 4D are plan views illustrating the semiconductor device in the manufacturing process.
Figure 4B:
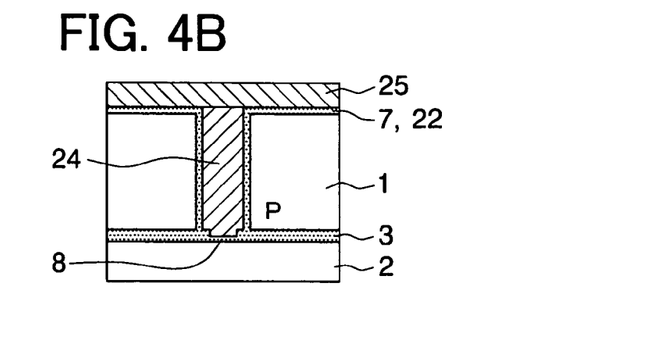
FIG. 4B, FIG. 4C, FIG. 4E, and FIG. 4F are cross-sectional views illustrating the semiconductor device taken along line IVB-IVB in FIG. 4A, line IVC-IVC in FIG. 4A, line IVE-IVE in FIG. 4D, and line IVF-IVF in FIG. 4D, respectively.
Figure 4C:
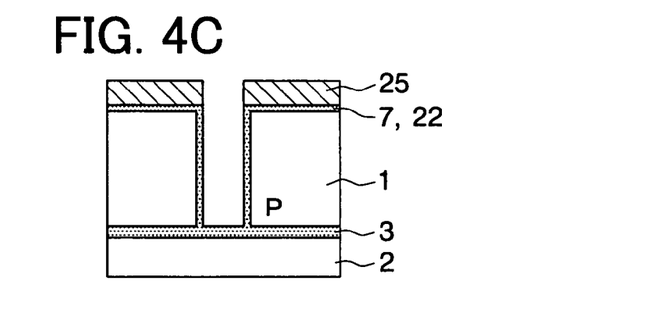

In a process illustrated in FIG. 4A-FIG. 4C, a resist 25 is formed on the oxide layer 22 and the polysilicon layer 24. The resist 25 is pattern-formed by a photolithography process so that resist 25 has an opening above a part of the polysilicon layer 24 filled in the trench 6. Then, the part of the polysilicon layer 24 is removed, for example, by dry etching using the resist 25 as a mask. Thereby, the polysilicon layer 24 remain in the trench 6 in a cross-section taken along line IVB-IVB in FIG. 4A, as illustrated in FIG. 4B, and the polysilicon layer 24 is removed from the trench 6 in a cross-section taken along line IVC-IVC in FIG. 4B, as illustrated in FIG. 4C. After that, the resist 25 is removed.

Figure 4D:
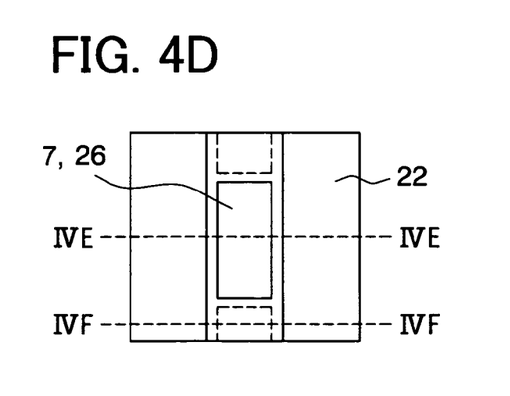
Figure 4E:
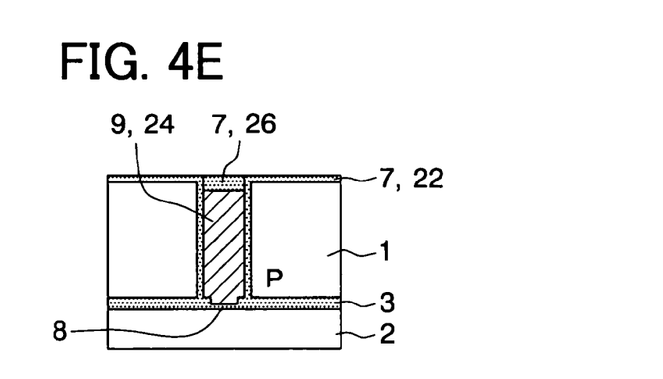
Figure 4F:
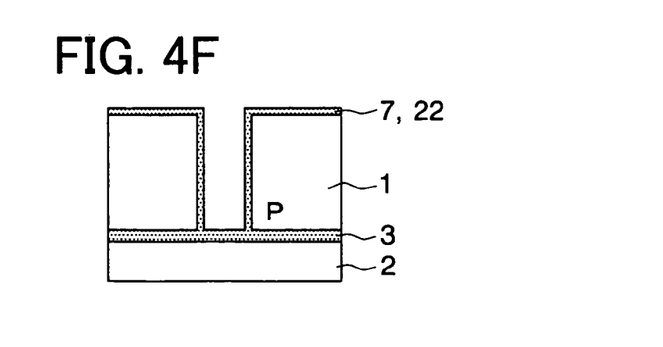

In a process illustrated in FIG. 4D-4F, the SOI substrate 4 is thermally oxidized so that a surface of the polysilicon layer 24 exposed to the outside of the SOI substrate 4 is covered with an oxide layer 26. Thereby, the polysilicon layer 24 that remains in the trench 6 becomes the floating gate 9. The oxide layer 26 becomes the oxide layer 7 illustrated in FIG. 1B.

Figure 5A:
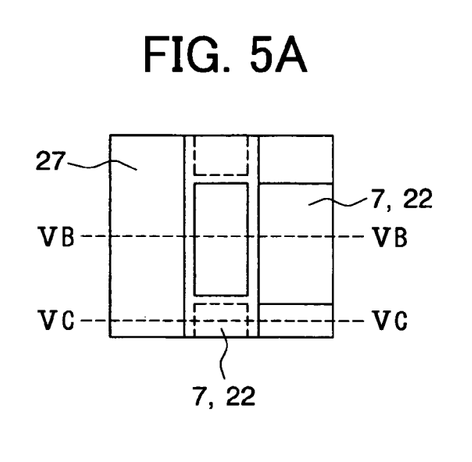
FIG. 5A and FIG. 5D are plan views illustrating the semiconductor device in the manufacturing process.
Figure 5B:
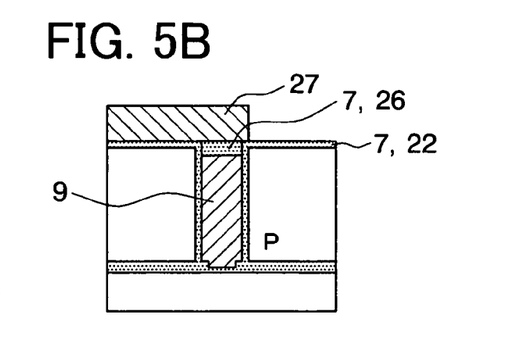
FIG. 5B, FIG. 5C, FIG. 5E, and FIG. 5F are cross-sectional views illustrating the semiconductor device taken along line VB-VB in FIG. 5A, line VC-VC in FIG. 5A, line VE-VE in FIG. 5D, and line VF-VF in FIG. 5D, respectively.
Figure 5C:
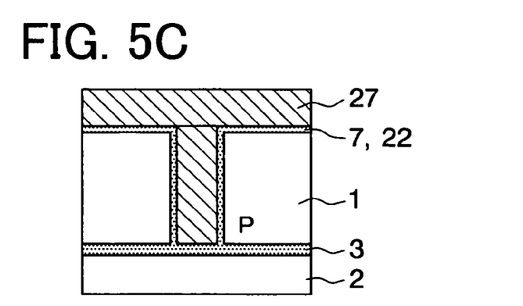
Figure 5D:
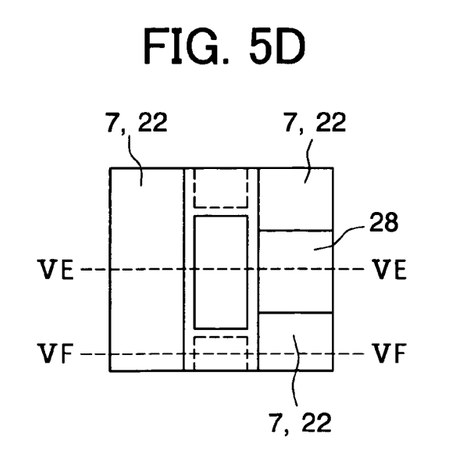
Figure 5E:
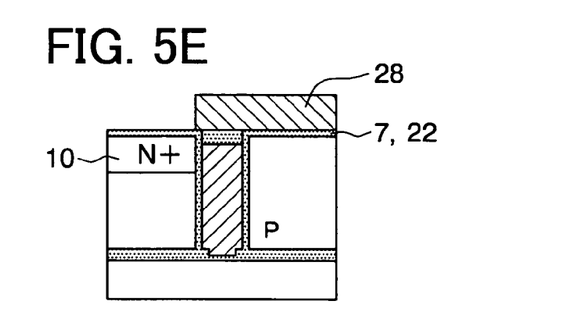
Figure 5F:
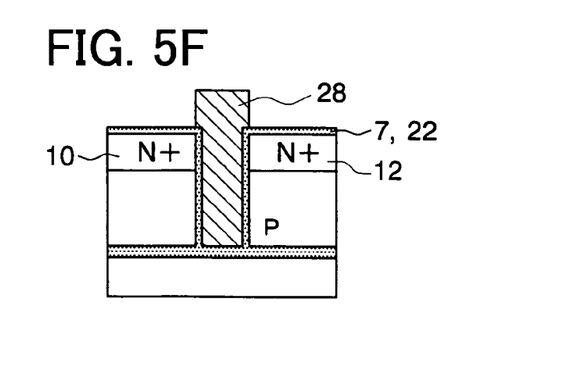

In a process illustrated in FIG. 5A-FIG. 5C, a resist 27 is pattern-formed so as to have an opening above a portion where the channel region is provided. Then, for example, boron ions are implanted using the resist 27 as a mask, for controlling a threshold value (Vt) at the channel region. Then, the resist 27 is removed. In a process illustrated in FIG. 5D-FIG. 5F, a resist 28 is pattern-formed so as to have openings above portions where the control gate 10, the source region 11, and the source region 12 are formed. Then, for example, arsenic (As) ions of about $5 \times 10^{15}$ dose are implanted using the resist 28 as a mask. In FIG. 5F, the drain region 12 is illustrated, as an example. After implanting As ions, the resist 28 is removed.

Figure 6A:
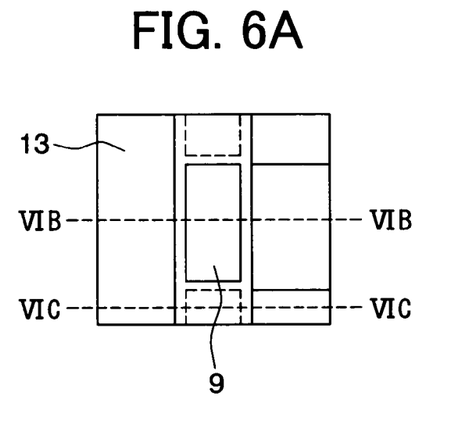
FIG. 6A and FIG. 6D are plan views illustrating the semiconductor device in the manufacturing process.
Figure 6B:
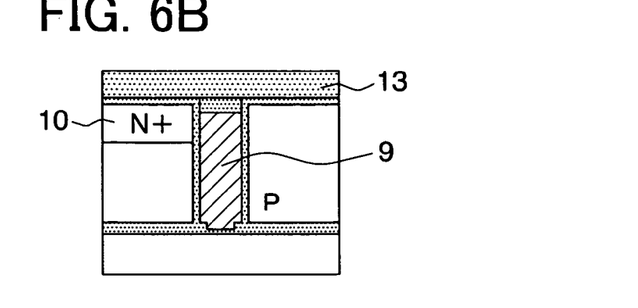
FIG. 6B, FIG. 6C, FIG. 6E, and FIG. 6F are cross-sectional views illustrating the semiconductor device taken along line VIB-VIB in FIG. 6A, line VIC-VIC in FIG. 6A, line VIE-VIE in FIG. 6D, and line VIF-VIF in FIG. 6D, respectively.
Figure 6C:
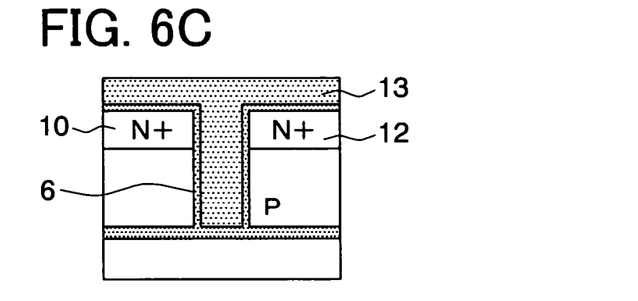

In a process illustrated in FIG. 6A-6C, a protective layer 13 is formed on the oxide layer 22 and the oxide layer 26. The protective layer 13 functions an insulating layer for isolating the SOI substrate 4 and wirings including the source line 16 and the bit line 17. The protective film 13 is made of boron phosphorus silicate glass (BPSG), for example. The protective layer 13 fills a part of the trench 6 where the floating gate 9 is not formed, as illustrated in FIG. 6C.

Figure 6D:
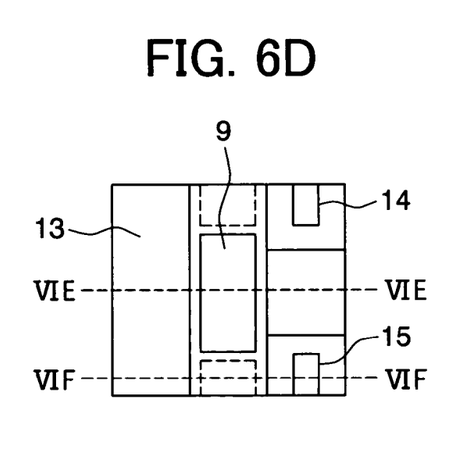
Figure 6E:
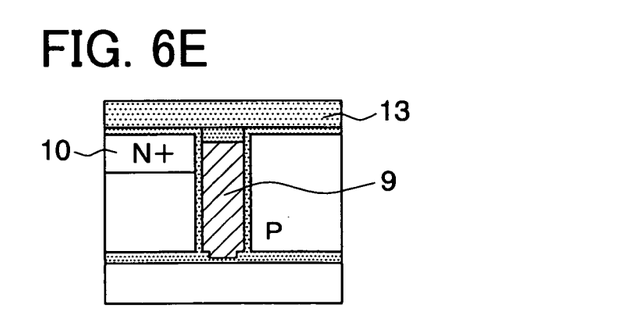
Figure 6F:
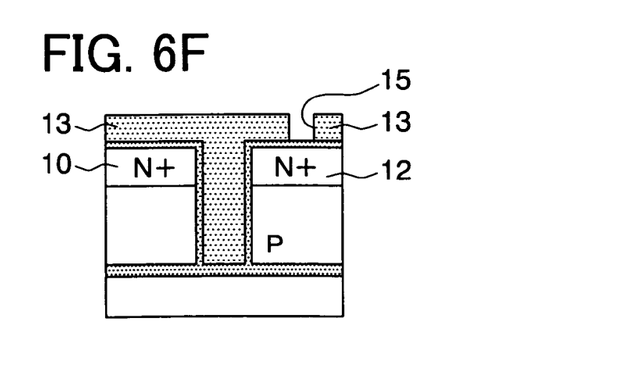

In a process illustrated in FIG. 6D-FIG. 6F, the contact holes 14 and 15 are provided in the protective layer 13 by a photolithography process and an etching process. The contact hole 14 extends toward the source region 11 and the contact hole 15 extends toward the drain region 12.

Figure 7A:
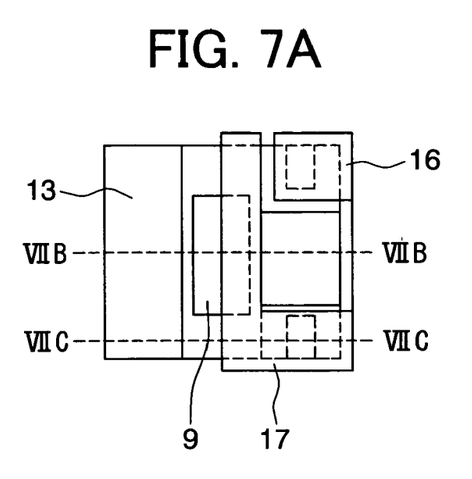
FIG. 7A is a plan view illustrating the semiconductor device in the manufacturing process.
Figure 7B:
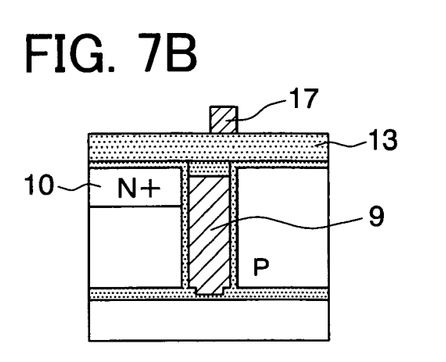
FIG. 7B and FIG. 7C are cross-sectional views illustrating the semiconductor device taken along line VIIB-VIIB in FIG. 7A and line VIIC-VIIC in FIG. 7A, respectively.
Figure 7C:
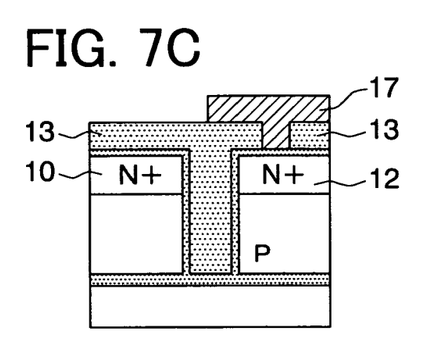

In a process illustrated in FIG. 7A-7C, the source line 16 and the bit line 17 are formed on the protective layer 13 by a photolithography process and an etching process. The source line 16 and the bit line 17 are made of aluminum-silicon-copper (AlSiCu), for example.

Figure 8A:
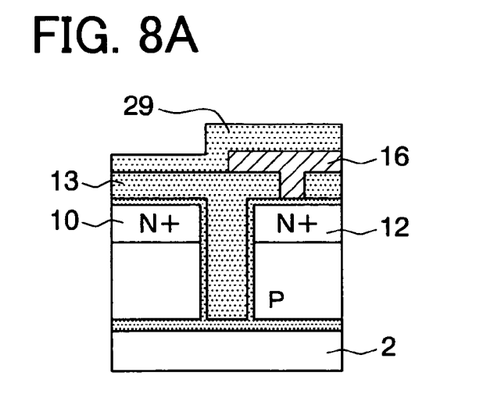
FIG. 8A-FIG. 8F are cross-sectional views illustrating the semiconductor device in the manufacturing process, in which the semiconductor device is taken along a line corresponding to line VIIC-VIIC in FIG. 7A.

In a process illustrated in FIG. 8A, the protective layer 29 is formed on the source line 16 and the bit line 17. Thereby, the manufacturing process on a front-surface side of the element-forming substrate 1 ends.

Figure 8B:
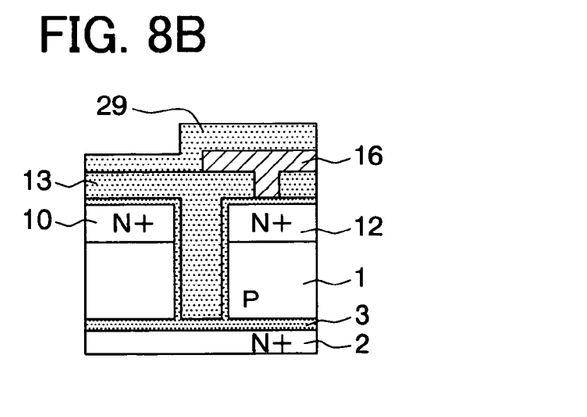
Figure 8C:
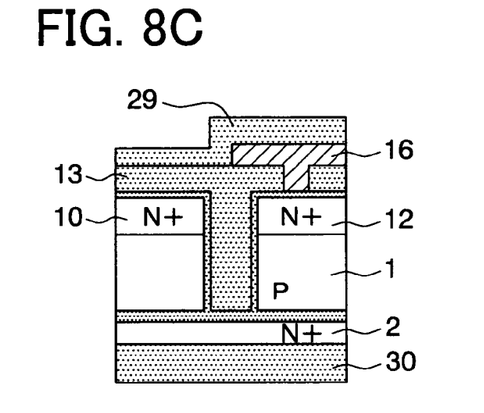

In a process illustrated in FIG. 8B, the supporting substrate of the SOI substrate 4 is shaved so as to have a predetermined thickness. Then, ions are implanted to the supporting substrate so that rear electrode 2 has the N+ type conductivity. In a process illustrated in FIG. 8C, an insulating layer 30 is formed on the rear electrode 2.

Figure 8D:
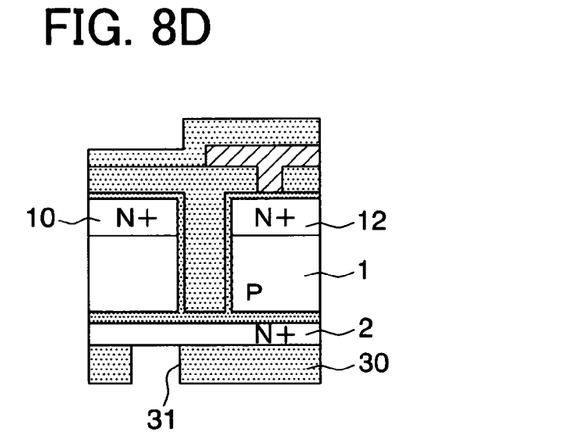
Figure 8E:
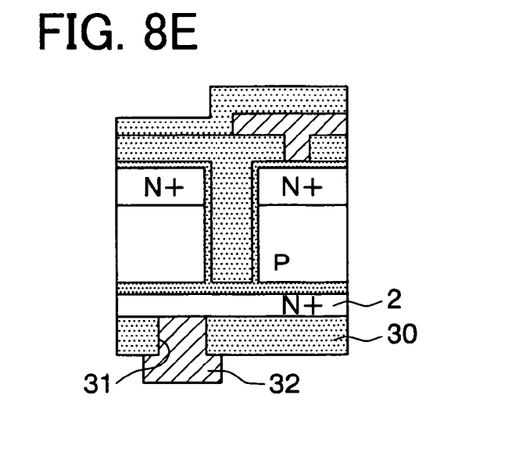
Figure 8F:
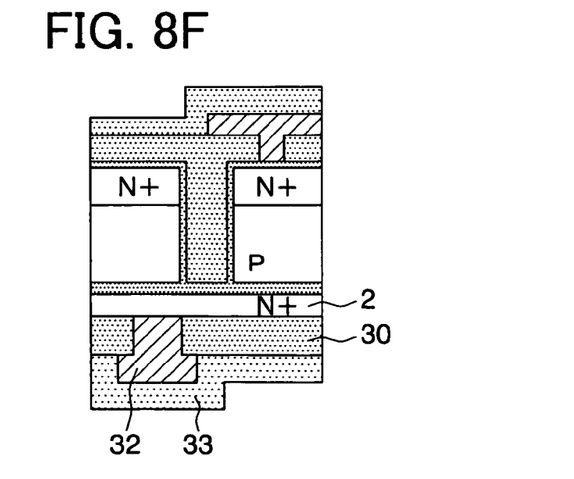

In a process illustrated in FIG. 8D, a contact hole 31 is provided in the insulating layer 30 so as to extend to the rear electrode 2. In a process illustrated in FIG. 8E, the wiring layer 32 is formed on the insulating layer 30 so as to fill the contact hole 31. In a process illustrated in FIG. 8F, the protective layer 33 is formed on the insulating layer 30 and the wiring layer 32. In this way, the semiconductor device is manufactured.

In a case where the semiconductor device is used for a whole-erasable flash memory, data is written into and read from the semiconductor device, for example, as described below.

When the data is written into the semiconductor device, a voltage is applied to the control gate 10 and the bit line 17 of the memory cell 5 into which the data is written. In addition, an electric current is applied to the source line 16 of the memory cell 5 into which the data is written. Thereby, the channel region is provided between the source region 11 and the drain region 12, and the electric current flows between the source region 11 and the drain region 12. At this time, an electron accelerated at the channel region and having a high energy is implanted into the floating gate 9 in the trench 6 through the oxide layer 7. As a result, the data is written into the semiconductor device by storing an electric change into the floating gate 9.

When the data in the semiconductor device is erased, a voltage is applied to the rear electrode 2 by applying a voltage to the wiring layer 32. Thereby, the electrons stored in the floating gates 9 of all the memory cells 5 are extracted to the rear electrode 2, and the whole data written in the memory cells 5 is collectively erased.

In this way, when the data is erased, an erasing voltage is applied to all the memory cells 5 in the memory mat regardless of the position of the memory cells 5. Thus, a difference in an easing property is not generated among the memory cells 5 and a difference in the easing property of the memory cells 5 can be reduced.

As described above, in each of the memory cells 5, the oxide layer 7 is disposed on the sidewall of the trench 6, the tunnel oxide layer 8 is disposed at the bottom portion of the trench 6, the floating gate 9 is formed on the tunnel oxide layer 8, and the rear electrode 2 is disposed on the opposing side of the tunnel oxide layer 8 from the floating gate 9. The rear electrode 2 is configured to extract the electron stored in the floating gate 9.

Thus, uniform voltage can be applied to the rear electrode 2 located in each of the memory cells 5 regardless of the position of each of the memory cells 5 and a wiring resistance. Thereby, a difference in the erasing property among the memory cells 5 due to a voltage drop of the wiring resistance can be restricted and an error recognition of the data can be restricted.

Second Embodiment

Figure 9:
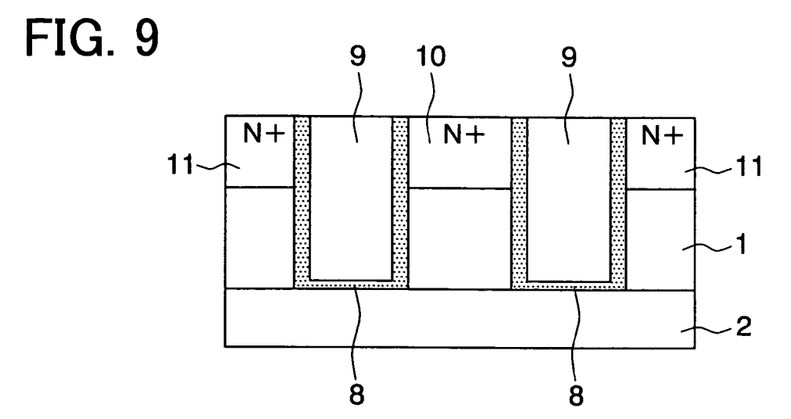
FIG. 9 is a cross-sectional view illustrating a semiconductor device according to a second embodiment of the invention.

In a semiconductor device according to a second embodiment of the invention, as illustrated in FIG. 9, the element-forming substrate 1 is directly disposed on the rear electrode 2 without the buried oxide layer 3 illustrated in FIG. 1B. In FIG. 9, some components including the source line 16 are not illustrated.

The rear electrode 2 is the N+ type layer and is in contact with the tunnel oxide layer 8 and the element-forming substrate 1. In this way, the buried oxide layer 3 described in the first embodiment may be not provided. Thus, the semiconductor device may also be formed, for example, in a bulk wafer without being limited to the SOI substrate 4.

Third Embodiment

Figure 10:
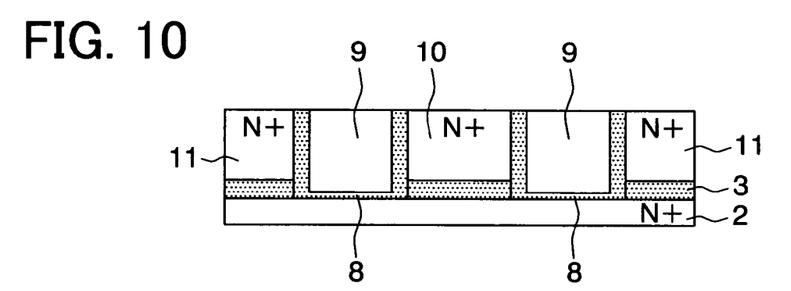
FIG. 10 is a cross-sectional view illustrating a semiconductor device according to a third embodiment of the invention.

A semiconductor device according to a third embodiment of the invention will be described with reference to FIG. 10. The element-forming substrate 1 in the present semiconductor device is thin and has a thickness of about 1 μm to about 2 μm, for example. Thus, all portions in the element-forming substrate 1 become the N+ type diffusion layer. The N+ type diffusion layer becomes the control gate 10, the source region 11, and the drain region 12.

In this way, the SOI substrate 4 having the thin element-forming substrate 1 may be used. The semiconductor device may also be disposed in a large scale integration (LSI) that is made of a thin-film SOI.

Fourth Embodiment

Figure 11:
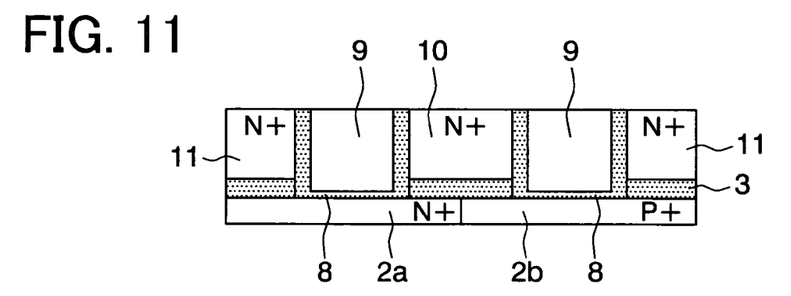
FIG. 11 is a cross-sectional view illustrating a semiconductor device according to a fourth embodiment of the invention.

A semiconductor device according to a fourth embodiment of the invention will be described with reference to FIG. 11. In the semiconductor device according to the present embodiment, the rear electrode 2 includes N+ type regions 2a and P+ type regions 2b. That is, the rear electrode 2 of a part of the memory cells 5 is the N+ type region 2a and the rear electrode 2 of the other part of the memory cells 5 is the P+ type region 2b. In the whole of the semiconductor device, the N+ type regions 2a and the P+ type regions 2b are arranged in a checked pattern, for example.

When the data is erased, different biases are applied to the N+ type regions 2a and the P+ type regions. Thereby, the data of the memory cells 5 may be erased selectively by selecting one of the N+ regions 2a and the P+ regions 2b that configurate the rear electrode 2.

Fifth Embodiment

Figure 12:
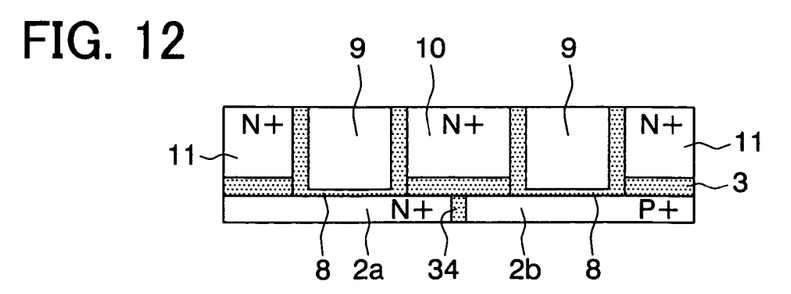
FIG. 12 is a cross-sectional view illustrating a semiconductor device according to a fifth embodiment of the invention.

A semiconductor device according to a fourth embodiment of the invention will be described with reference to FIG. 12. In the above-described fourth embodiment, the N+ type regions 2a are in contact with P+ type regions 2b so as to configurate PN junctions. Thus, when the bias is applied to the N+ type regions 2a and the P+ type region 2b, it is required that a forward bias is not applied to the PN junctions. In the semiconductor device according to the present embodiment, the N+ type regions 2a are isolated from the P+ type regions 2b through separating trenches 34. In the separating trenches 34, an insulating member such as an oxide layer is filled.

Thereby, the bias can be applied to the N+ type regions 2a and the P+ type regions 2b regardless of a forward operation of the N+ type regions 2a and the P+ type regions 2b.

Sixth Embodiment

Figure 13:
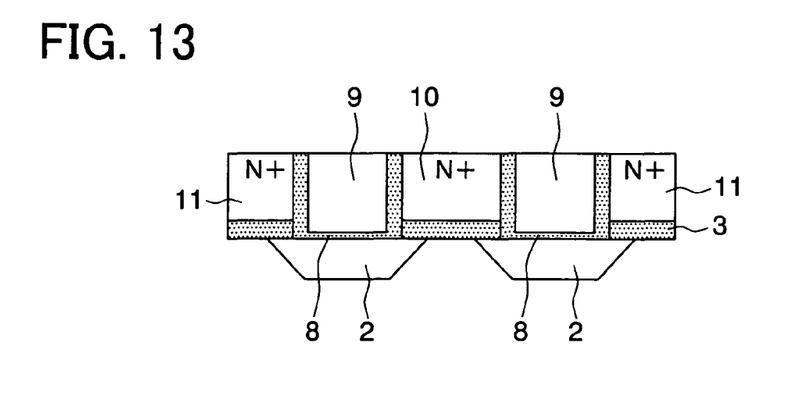
FIG. 13 is a cross-sectional view illustrating a semiconductor device according to a sixth embodiment of the invention.

A semiconductor device according to a sixth embodiment of the invention will be described with reference to FIG. 13. In the semiconductor device according to the present embodiment, the rear electrode 2 of each of the memory cells 5 is separated from each other. The rear electrodes 2 are formed by a microelectromechanical system (MEMS) technique, for example.

The rear electrodes 2 have a dotted shape and cover the corresponding tunnel oxide layer 8. Each of the rear electrodes 2 is covered with a protective layer (not shown).

The rear electrode 2 of all the memory cells 5 may be the N+ type region or the rear electrode 2 of all the memory cells 5 may be the P+ type region. Alternatively, the rear electrode 2 of a part of the memory cells 5 may be the N+ type region and the rear electrode 2 of the other part of the memory cells 5 may be the P+ type region.

Seventh Embodiment

A semiconductor device according to a seventh embodiment of the invention will be described with reference to FIG. 14. In the semiconductor device according to the present embodiment, a voltage can be applied from a front-surface side of the element-forming substrate 1 to the rear electrode 2.

The rear electrode 2 according to the present embodiment includes a P-type layer 2c and an N+ type region 2d formed on a surface portion of the P- type layer 2c. The N+ type region 2d is provided at the whole region where the memory cells 5 are formed.

The buried oxide layer 3 is formed on the rear electrode 2, and the element-forming substrate 1 is formed on the buried oxide layer 3 so as to configurate the SOI substrate 4. At an outer edge portion of the semiconductor device, the whole region of the element-forming substrate 1 has the N+ conductivity type.

Figure 14:
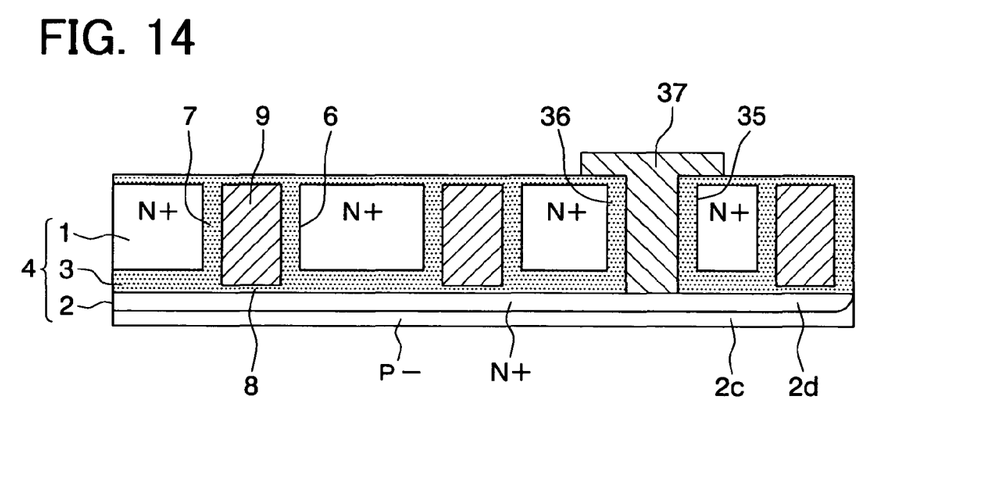
FIG. 14 is a cross-sectional view illustrating an outer edge portion of a semiconductor device according to a seventh embodiment of the invention.

As illustrated in FIG. 14, the structure illustrated in FIG. 1B can be formed at the outer edge portion of the semiconductor device. The SOI substrate 4 that includes the N+ type region 2d in the rear electrode 2 is prepared. Then, the trenches 6 are provided so as to penetrate through the element-forming substrate 1 and the buried oxide layer 3 to the rear electrode 2. The oxide layer 7 is disposed on the sidewall of each of the trenches 6. At the bottom portion of each of the trenches 6, the tunnel oxide layer 8 is disposed. The floating gate 9 is disposed on the oxide layer 7 and the tunnel oxide layer 8. The oxide layer 7 is also disposed on an opposite side of the floating gate 9 from the tunnel oxide layer 8. Thereby, the floating gate 9 is completely insulated by the oxide layer 7 and the tunnel oxide layer 8.

At the outer edge of the semiconductor device, a trench 35 penetrates the element-forming substrate 1 and the buried oxide layer 3 to the rear electrode 2. On a side wall of the trench 35, an oxide layer 36 is disposed. The oxide layer 36 is made of silicon dioxide, for example. A buried electrode 37 is formed in the trench 35 through the oxide layer 36. The buried electrode 37 is made of metal, for example, aluminum.

The trench 35 may be formed at the same time when the trenches 6 and the floating gates 9 are formed. Alternatively, the trench 35 and the buried electrode 37 may be formed after the trenches 6 are formed. In the present case, the trench 35 and the buried electrode 37 may be formed at the same time when the bit lines 17 and the source lines 16 are formed.

The buried electrode 37 is in contact with the N+ type region 2d of the rear electrode 2. Thus, the buried electrode 37 is electrically coupled with the N+ type region 2d. Thereby, a voltage is applied from the front-surface side of the element-forming substrate 1 to the rear electrode 2 through the buried electrode 37. The buried electrode 37 is electrically coupled with an external device on the front-surface side in a manner similar to the source lines 16, the bit lines 17, and the word lines (the control gates 10).

A planer shape of the buried electrode 37 may be a line shape that surrounds the memory mat. Alternatively, the planer shape of the buried electrode 37 may be a dotted shape.

When the data is erased, the voltage is applied to the buried electrode 37. Thereby, the electrodes stored in the floating gates 9 of the memory cells 5 are extracted to the N+ type region 2d of the rear electrode 2. Thus, the date written in all the memory cells 5 can be erased collectively.

The rear electrode 2 includes the N+ type region 2d that has a high impurity concentration. Thus, a resistance component in a planar direction of the rear electrode 2 is reduced at a time when the data is erased. Thereby, the difference in the erasing property among the memory cells 5 due to the position of each of the memory cells 5 can be reduced.

In this way, the voltage can be applied from the front-surface side of the element-forming substrate 1 to the rear electrode 2 by providing the buried electrode 37.

In the above-described example, the buried electrode 37 is disposed at an outer peripheral portion of the memory mat. The buried electrode 37 may also be disposed at an outer peripheral portion of each of the memory cells 5. The buried electrode 37 may also be disposed at a clearance among the source lines 16, the bit lines 17, and the word lines (the control gates 10).

Eighth Embodiment

Figure 15:
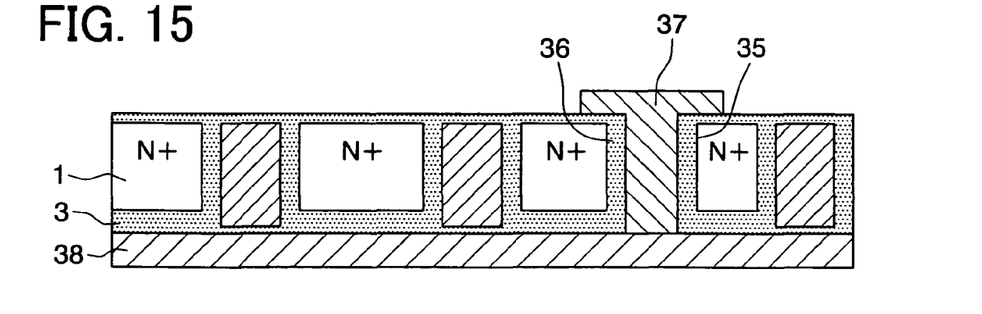
FIG. 15 is a cross-sectional view illustrating an outer edge portion of a semiconductor device according to an eighth embodiment of the invention.

A semiconductor device according to an eighth embodiment will be described with reference to FIG. 15. In the present embodiment, a conductive layer 38 is provided instead of the rear electrode 2 illustrated in FIG. 14. The conductive layer 38 is made of metal such as aluminum or polysilicon, for example.

The buried oxide layer 3 is disposed on the conductive layer 38 and the element-forming substrate 1 is disposed on the buried oxide layer 3. The buried electrode 37 is in contact with the conductive layer 38. Thus, buried oxide layer 37 is electrically coupled with the conductive layer 38.

In a case where the conductive layer 38 is made of a metal layer, the memory cells 5 are formed on the surface of the buried oxide layer 3 that has a large thickness. After that, a thickness of the buried oxide layer 3 is reduced from the rear-surface side, and the conductive layer 38 is formed on the rear surface of the buried oxide layer 3.

In a case where the conductive layer 38 is made of polysilicon, an SOI substrate including a supporting substrate, an insulating layer disposed on the supporting substrate, and a polysilicon layer disposed on the insulating layer is prepared. Then, the above-described element structure is formed on the polysilicon layer. After that, the supporting substrate, the insulating layer, and a rear portion of the polysilicon layer are removed. Thereby, the semiconductor device illustrated in FIG. 15 can be formed.

By providing the conductive layer 38 instead of the rear electrode 2, a resistance component in a planar direction of the conductive layer 38 can be reduced, and a voltage can be applied from the front-surface side of the element-forming substrate 1 to the conductive layer 38.

Ninth Embodiment

Figure 16:
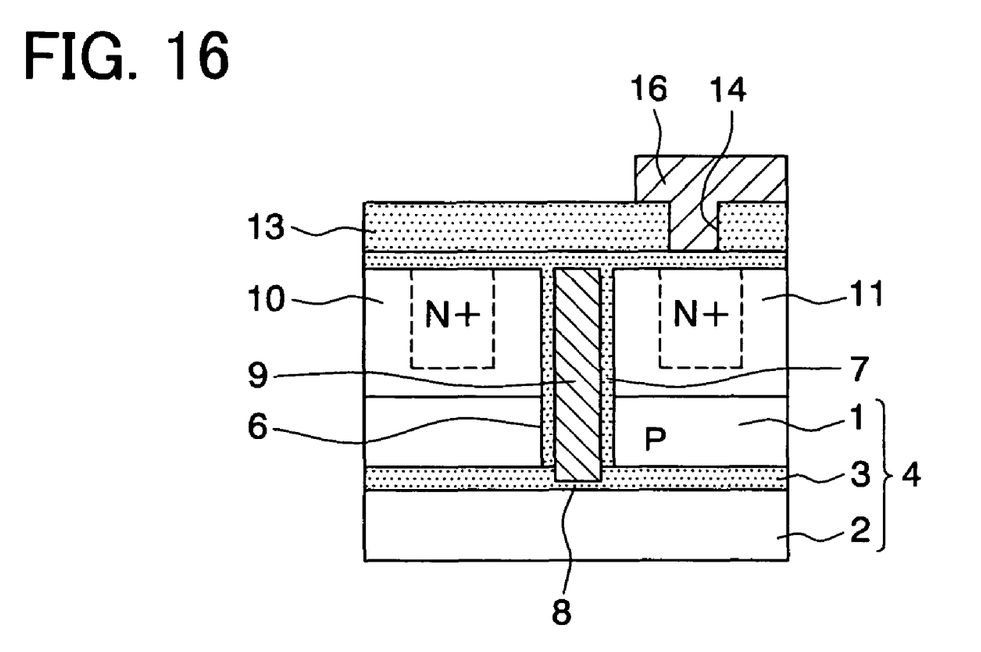
FIG. 16 is a cross-sectional view illustrating a semiconductor device according to a ninth embodiment of the invention.

A semiconductor device according to a ninth embodiment of the invention will be described with reference to FIG. 16. In FIG. 16, the semiconductor device is taken along a line corresponding to line IB-IB in FIG. 1A. In the present embodiment, the control gate 10 of each of the memory cells 5 is formed by a thermal diffusion of a buried layer having a high impurity concentration.

For example, buried trenches are provided in the element-forming substrate 1 and buried layers are formed in the respective buried trenches. Then, the buried layers are thermally diffused. Thereby, the control gate 10 and the source region 11 are formed. The drain region 12 (not shown) is also formed in a manner similar to the control gate 10 and the source region 11. Each of dashed line in FIG. 16 illustrates a trace of the buried trenches provided in the element-forming substrate 1.

Figure 17A:
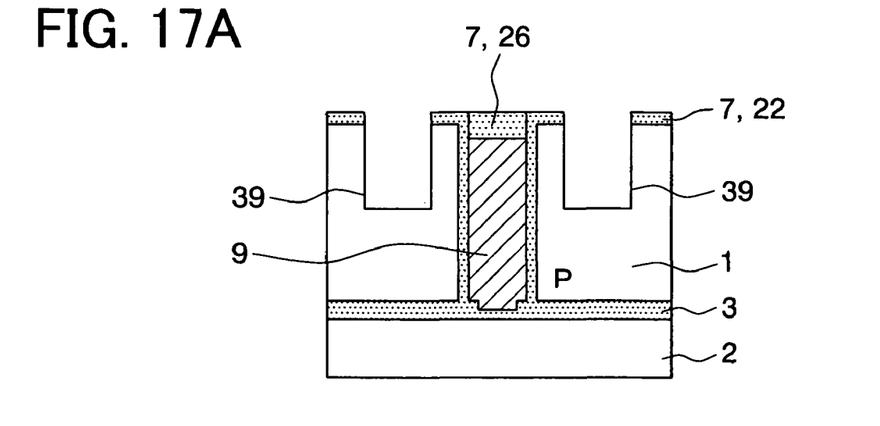
FIG. 17A-FIG. 17C are cross-sectional views illustrating the semiconductor in the manufacturing process according to the ninth embodiment.
Figure 17B:
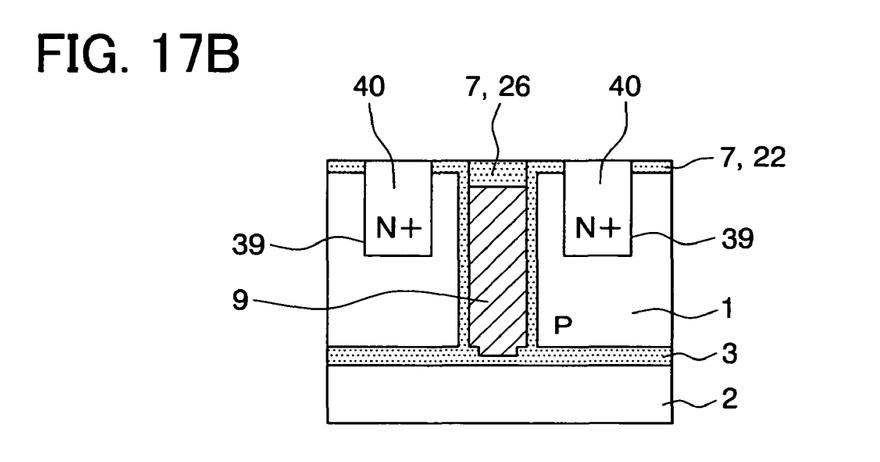
Figure 17C:
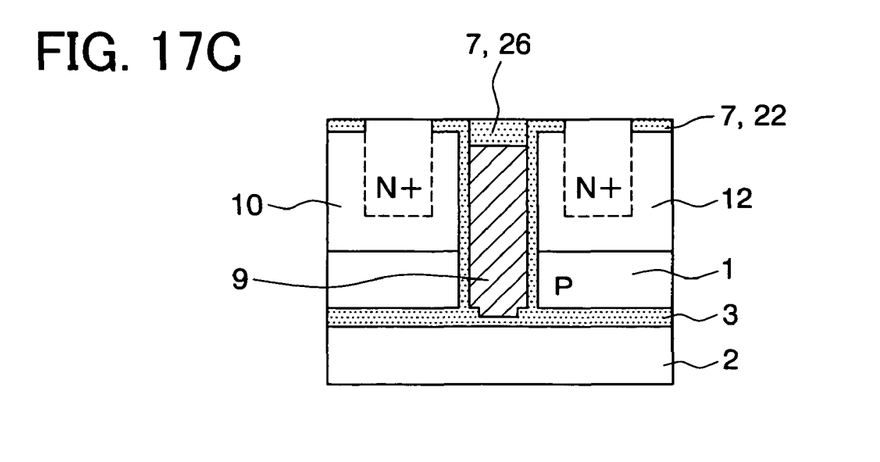

A method of forming the control gate 10 will be described with reference to FIG. 17A-FIG. 17C. In FIG. 17A-FIG. 17C, each of the cross-sectional views illustrating the semiconductor device taken along a line corresponding to line IVC-IVC in FIG. 4A.

In the present manufacturing method, the control gate 10, the source region 11, and the drain region 12 are formed after the floating gate 9 is formed. Thus, the processes illustrated in FIG. 2A-FIG. 4F are performed before the control gate 10, the source region 11, and the drain region 12 are formed.

In a process illustrated in FIG. 17A, a resist (not shown) is formed so that regions where the control gate 10, the source region 11, the drain region 12 are respectively formed are exposed. Then, the buried trenches 39 are provided in the element-forming substrate 1 so that each of the buried trenches 39 and the floating gate 9 in the trench 6 are located on opposite sides of the oxide layer 7. Then, the resist is removed.

In a process illustrated in FIG. 17b, buried layers 40 are formed in the respective buried trenches 39. The buried layers 40 are made of N+ type polysilicon, for example.

In a process illustrated in FIG. 17c, the buried layers 40 are heated so that the buried layers 40 are thermally diffused from sidewalls of the buried trenches 39 to the element-forming substrate 1. Thereby, the control gate 10, the source region 11, and the drain region 12 are formed.

After that, the buried layers 40 exposed from the oxide layer 22 is covered with an oxide layer, and the processes illustrated in FIG. 6A-8F are performed.

In a case where the control gate 10 is formed by ion implantation, a depth of the control gate is limited. However, in the present manufacturing method, the control gate 10 is formed by the thermal diffusion of the buried layer 40. Thus, by controlling a depth of the buried trench 39, the depth of the control gate 10 in the element-forming substrate 1 can be controlled. In addition, a depth of the source region 11 and a depth of the drain region 12 can also be controlled by controlling the depth of the corresponding buried trench 39.

As a result, a cross-sectional area of the channel region and a cross-sectional area of the control gate 10 increase, and thereby a current capability of the semiconductor device can be improved. Thus, in the present semiconductor device, writing and erasing data can be performed easily.

In the above-described method, the buried trenches 39 are provided after the floating gate 9 is formed. Alternatively, the buried trenches 39 are provided at the same time when the trench 6 is provided in the process illustrated in FIG. 2D. In this way, a time when the buried trenches 39 are provided is not limited to after forming the floating gate 9.

In the process illustrated in FIG. 17A, the buried trenches 39 are provided so as not to reach the buried oxide layer 3. Alternatively, the buried trenches 39 may be provided so as to reach the buried oxide layer 3.

Other Embodiments

Although the present invention has been fully described in connection with the preferred embodiments thereof with reference to the accompanying drawings, it is to be noted that various changes and modifications will become apparent to those skilled in the art.

For example, the dotted shaped rear electrodes 2 in the sixth embodiment may be applied to the semiconductor device according to other embodiments. In this way, a structure of the semiconductor device according to one of the first to the ninth embodiments can be applied to the semiconductor device according to another one of the first to the ninth embodiments.

The substrate used in the semiconductor device according to the first to the ninth embodiments is not limited to the SOI substrate 4. The substrate may be a bulk wafer.

What is claimed is:

1. A semiconductor device comprising:
   a semiconductor substrate;
   a plurality of memory cells located in the semiconductor substrate, each of the plurality of memory cells including
      a trench provided in the semiconductor substrate,
      an oxide layer disposed on a sidewall of the trench,
      a tunnel oxide layer disposed at a bottom portion of the trench,
      a floating gate disposed in the trench so as to be surrounded by the oxide layer and the tunnel oxide layer,
      an erasing electrode disposed on an opposing side of the tunnel oxide layer from the floating gate, and
      a wiring layer disposed on an opposing side of the erasing electrode from the tunnel oxide layer, wherein
      the floating gate is configured so that a data is written into and read from the floating gate and the erasing electrode is configured to erase the data written in the floating gate; and
   a plurality of bit lines and a plurality of source lines, wherein each of the plurality of bit lines and each of the plurality of source lines are alternately arranged on the plurality of memory cells in parallel with each other.

2. The semiconductor device according to claim 1, wherein:
   each of the plurality of memory cells includes a control gate;
   the control gate and the floating gate are located on opposite sides of the oxide layer; and
   the control gate is configured to write the data into the floating gate.

3. The semiconductor device according to claim 2, wherein the control gate is formed by
   providing a buried trench in the semiconductor substrate,
   forming a buried layer in the buried trench
   thermally diffusing the buried layer from a sidewall of the buried trench to the semiconductor substrate.

4. The semiconductor device according to claim 1, wherein:
   the erasing electrode of each of the plurality of memory cells is a layer having a first conductivity type; and
   the erasing electrode is in contact with the tunnel oxide layer.

5. A semiconductor device comprising:
   a semiconductor substrate;
   a plurality of memory cells located in the semiconductor substrate, each of the plurality of memory cells including
      a trench provided in the semiconductor substrate,
      an oxide layer disposed on a sidewall of the trench,
      a tunnel oxide layer disposed at a bottom portion of the trench,
      a floating gate disposed in the trench so as to be surrounded by the oxide layer and the tunnel oxide layer,
      an erasing electrode disposed on an opposing side of the tunnel oxide layer from the floating gate, and
      a wiring layer disposed on an opposing side of the erasing electrode from the tunnel oxide layer, wherein
      the floating gate is configured so that data is written into and read from the floating gate and the erasing electrode is configured to erase the data written in the floating gate; and
   a plurality of bit lines and a plurality of source lines, wherein each of the plurality of bit lines and each of the plurality of source lines are alternately arranged on the plurality of memory cells in parallel with each other, wherein:
   the erasing electrode of a part of the plurality of memory cells has a first conductivity type; and
   the erasing electrode of the other part of the plurality of memory cells has a second conductivity type.

6. The semiconductor device according to claim 5, further comprising
a separating trench provided between the easing electrode having the first conductivity type and the erasing electrode having the second conductivity type.

7. The semiconductor device according to claim 1, wherein the erasing electrode of each of the plurality of memory cells has a dotted shape.

8. The semiconductor device according to claim 1, wherein the semiconductor substrate is a silicon-on-insulator wafer.

9. The semiconductor device according to claim 1, wherein all of the erasing electrodes of the plurality of memory cells are integrated.

10. A semiconductor device comprising:
a semiconductor substrate;
a plurality of memory cells located in the semiconductor substrate, each of the plurality of memory cells including
   a trench provided in the semiconductor substrate,
   an oxide layer disposed on a sidewall of the trench,
   a tunnel oxide layer disposed at a bottom portion of the trench,
   a floating gate disposed in the trench so as to be surrounded by the oxide layer and the tunnel oxide layer, and
   an erasing electrode disposed on an opposing side of the tunnel oxide layer from the floating gate, wherein
   the floating gate is configured so that a data is written into and read from the floating gate and the erasing electrode is configured to erase the data written in the floating gate; and
a plurality of bit lines and a plurality of source lines, wherein each of the plurality of bit lines and each of the plurality of source lines are alternately arranged on the plurality of memory cells in parallel with each other, wherein
the erasing electrode of a part of the plurality of memory cells has a first conductivity type, and
the erasing electrode of the other part of the plurality of memory cells has a second conductivity type.

11. The semiconductor device according to claim 10, further comprising
a separating trench provided between the easing electrode having the first conductivity type and the erasing electrode having the second conductivity type.

* * * * *